US010014061B1

(12) United States Patent
Yip et al.

(10) Patent No.: US 10,014,061 B1
(45) Date of Patent: Jul. 3, 2018

(54) METHODS AND APPARATUS HAVING MULTIPLE SELECT GATES OF DIFFERENT RANGES OF THRESHOLD VOLTAGES CONNECTED IN SERIES WITH MEMORY CELLS

(71) Applicant: MICRON TECHNOLOGY, INC., Boise, ID (US)

(72) Inventors: Aaron S. Yip, Los Gatos, CA (US); Mark A. Helm, Santa Cruz, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/484,369

(22) Filed: Apr. 11, 2017

(51) Int. Cl.
*G11C 16/04* (2006.01)
*G11C 16/34* (2006.01)
*G11C 16/10* (2006.01)
*G11C 16/16* (2006.01)

(52) U.S. Cl.
CPC ...... *G11C 16/3427* (2013.01); *G11C 16/0483* (2013.01); *G11C 16/10* (2013.01); *G11C 16/16* (2013.01); *G11C 16/3459* (2013.01)

(58) Field of Classification Search
CPC . G11C 16/3427; G11C 16/3459; G11C 16/16; G11C 16/0483; G11C 16/10
USPC .................................................... 365/185.02
See application file for complete search history.

(56) References Cited

U.S. PATENT DOCUMENTS

| 5,635,747 A * | 6/1997 | Lee ...................... G11C 17/123 257/316 |
| 5,812,454 A * | 9/1998 | Choi .................. G11C 16/0483 257/E27.103 |
| 7,450,422 B2 | 11/2008 | Roohparvar |
| 2003/0206443 A1 * | 11/2003 | Sakui .................... H01L 27/115 365/185.17 |

OTHER PUBLICATIONS

T. Tanzawa "Segmented Memory and Operation"; U.S. Appl. No. 15/241,740, filed Aug. 19, 2016; Total pp. 38.

* cited by examiner

*Primary Examiner* — Tha-O H Bui
(74) *Attorney, Agent, or Firm* — Dicke, Billig & Czaja, PLLC

(57) ABSTRACT

Apparatus having a plurality of strings of series-connected memory cells, and methods of their operation, where each of the strings of series-connected memory cells is selectively connected to the same data line through a respective plurality of select gates connected in series between that string and the data line. One select gate of each of the pluralities of select gates has a threshold voltage within a first range of threshold voltages, and each remaining select gate of each of the pluralities of select gates has a threshold voltage within a second range of threshold voltages mutually exclusive from the first range of threshold voltages. Each of the select gates having a threshold voltage within the first range of threshold voltages has its control gate isolated from any of the other select gates having a threshold voltage within the first range of threshold voltages.

22 Claims, 12 Drawing Sheets

560 — Adjusting a Respective Threshold Voltage of Each Select Gate of a First Plurality of Select Gates Connected in Series Between a First String of Series-Connected Memory Cells and a Data Line Such That One Select Gate of the First Plurality of Select Gates Has its Respective Threshold Voltage in a First Range of Threshold Voltages, and Each Remaining Select Gate of the First Plurality of Select Gates Has its Respective Threshold Voltage in a Second Range of Threshold Voltages, Wherein the First Range of Threshold Voltages and the Second Range of Threshold Voltages are Mutually Exclusive 562 — Adjusting a Respective Threshold Voltage of Each Select Gate of a Second Plurality of Select Gates Connected in Series Between a Second String of Series-Connected Memory Cells and the Data Line Such That One Select Gate of the Second Plurality of Select Gates Has its Respective Threshold Voltage in the First Range of Threshold Voltages, and Each Remaining Select Gate of the Second Plurality of Select Gates Has its Respective Threshold Voltage in the Second Range of Threshold Voltages, Wherein Each Select Gate of the First Plurality of Select Gates Shares a Select Line with a Respective Select Gate of the Second Plurality of Select Gates, and Wherein the Select Line of the One Select Gate of the First Plurality of Select Gates is Isolated From the Select Line of the One Select Gate of the Second Plurality of Select Gates 564 — Adjusting a Respective Threshold Voltage of Each Select Gate of a Third Plurality of Select Gates Connected in Series Between a Third String of Series-Connected Memory Cells and the Data Line Such That One Select Gate of the Third Plurality of Select Gates Has its Respective Threshold Voltage in the First Range of Threshold Voltages, and Each Remaining Select Gate of the Third Plurality of Select Gates Has its Respective Threshold Voltage in the Second Range of Threshold Voltages, Wherein Each Select Gate of the Third Plurality of Select Gates Shares a Select Line With a Respective Select Gate of the First Plurality of Select Gates and With a Respective Select Gate of the Second Plurality of Select Gates, and Wherein the Select Line of the One Select Gate of the Third Plurality of Select Gates is Isolated From the Select Line of the One Select Gate of the First Plurality of Select Gates and From the Select Line of the One Select Gate of the Second Plurality of Select Gates

FIG. 5

METHODS AND APPARATUS HAVING MULTIPLE SELECT GATES OF DIFFERENT RANGES OF THRESHOLD VOLTAGES CONNECTED IN SERIES WITH MEMORY CELLS

TECHNICAL FIELD

The present disclosure relates generally to memory and, in particular, in one or more embodiments, the present disclosure relates to apparatus and methods of operating memory having a memory architecture including respective pluralities of select gates connected in series between strings of series-connected memory cells selectively connected to a common data line.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select gate is connected to a source, while each drain select gate is connected to a data line, such as column bit line.

To meet the demand for higher capacity memories, designers continue to strive for increasing memory density (e.g., the number of memory cells in a given area of an integrated circuit die). One way to increase the memory density is to reduce the spacing between memory cells.

BRIEF DESCRIPTION OF THE DRAWINGS

FIG. 5 is a flowchart of a method of operating a memory in accordance with another embodiment.

DETAILED DESCRIPTION

Figure 1:
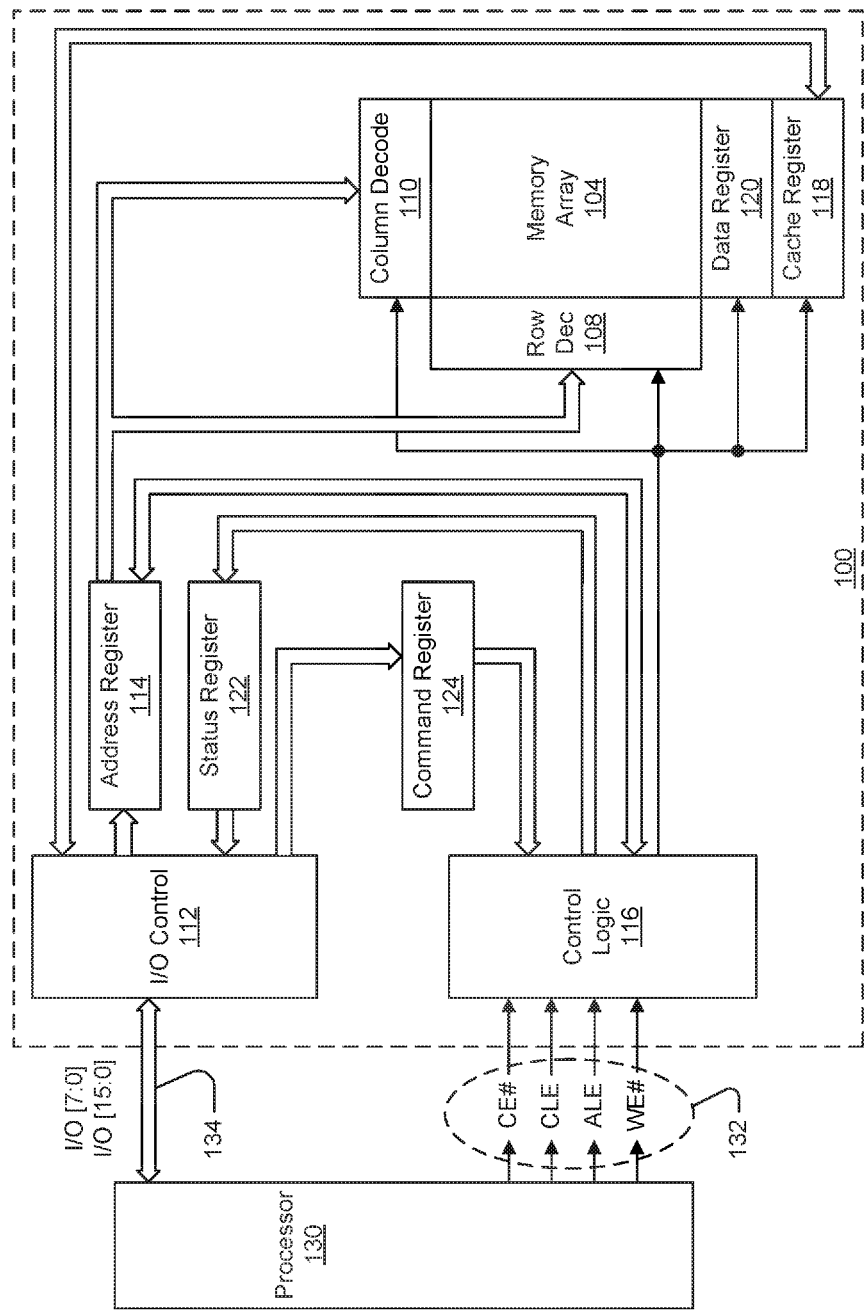
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are arranged in strings of series-connected memory cells. Blocks of memory cells (not shown in FIG. 1) generally include memory cells sharing a common set of access lines, and for some embodiments, might also share a common data line and/or a common source. Blocks of memory cells of at least a portion of array of memory cells 104 may include virtual select gates in a manner as described herein.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform access operations (e.g., read operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
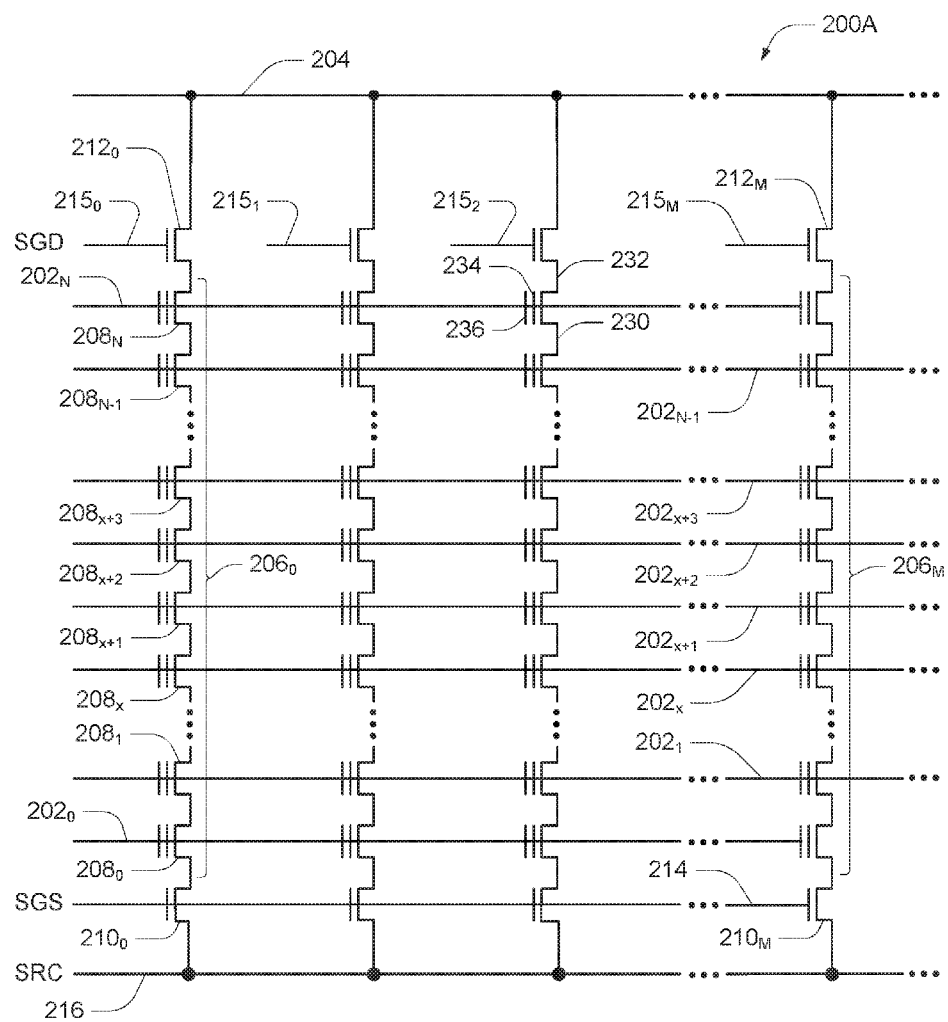
FIG. 2A is a schematic of a portion of an array of memory cells of the prior art.

FIG. 2A is a schematic of a portion of an array of memory cells 200A of the prior art. The array of memory cells 200A could be used in a memory similar to the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship.

Memory array 200A might include strings of series-connected memory cells, such as one of NAND strings $206_0$ to $206_M$. Each NAND string 206 might be connected (e.g., selectively connected) to a source 216 (e.g., a shared source) and might include memory cells $208_0$ to $208_N$. The memory cells 208 may represent non-volatile memory cells for storage of data. Some memory cells 208 may further represent non-volatile "dummy" memory cells. One or more dummy memory cells might be provided at the edges of the NAND strings 206, such as at word lines $202_0$ and $202_N$, and may act to reduce disturb effects on remaining memory cells 208 of the NAND strings 206. Dummy memory cells are typically not used to store data accessible to a user of the memory. Alternatively, or in addition, some memory cells 208 of a NAND string 206 might be operated at a lower density than other memory cells 208 of the NAND string 206, e.g., at one bit per memory cell instead of two, to increase their reliability. There may be no intervening memory cells 208 between the edge word lines $202_0$ and $202_N$ and their nearest select gate 210 or 212, respectively.

The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be connected to respective select lines $215_0$ to $215_M$, such as drain select lines. Although depicted as traditional field-effect transistors, the select gates 210 and 212 may utilize a structure similar to (e.g., the same as) the memory cells 208. More than one select gate 210 may be connected in series between the memory cells 208 of a corresponding NAND string 206 and the source 216. More than one select gate 212 may be connected in series between the memory cells 208 of a corresponding NAND string 206 and the bit line 204.

A source of each select gate 210 might be connected to source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to source 216. A control gate of each select gate 210 might be connected to select line 214.

The drain of each select gate 212 might be connected to the bit line 204 for the corresponding NAND string 206. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to a respective select line 215, with each select line 215 isolated from each remaining select line 215.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to a word line 202.

Figure 2B:
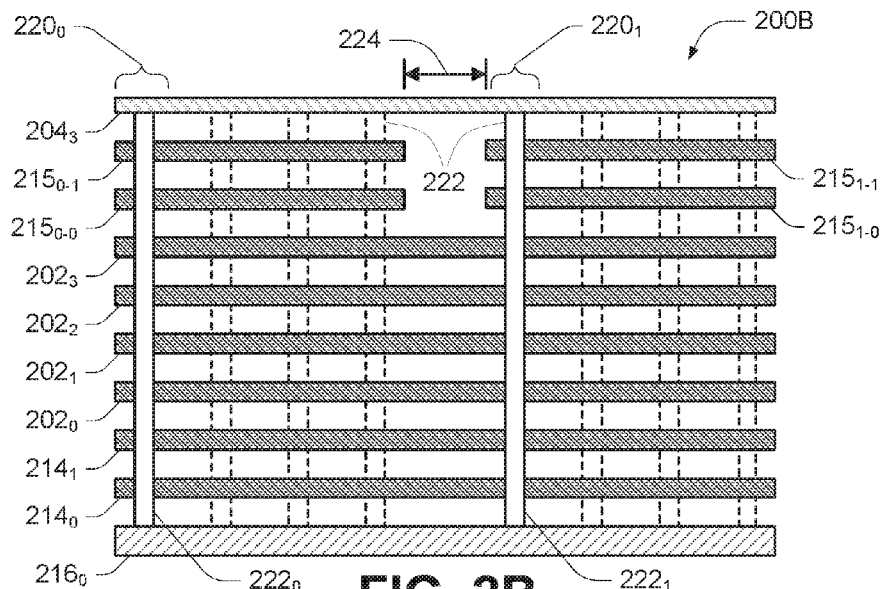
FIG. 2B is a cross-sectional view of a portion of an array of memory cells as an example of how the schematic of FIG. 2A might guide the formation of a three-dimensional array of memory cells.
Figure 2C:
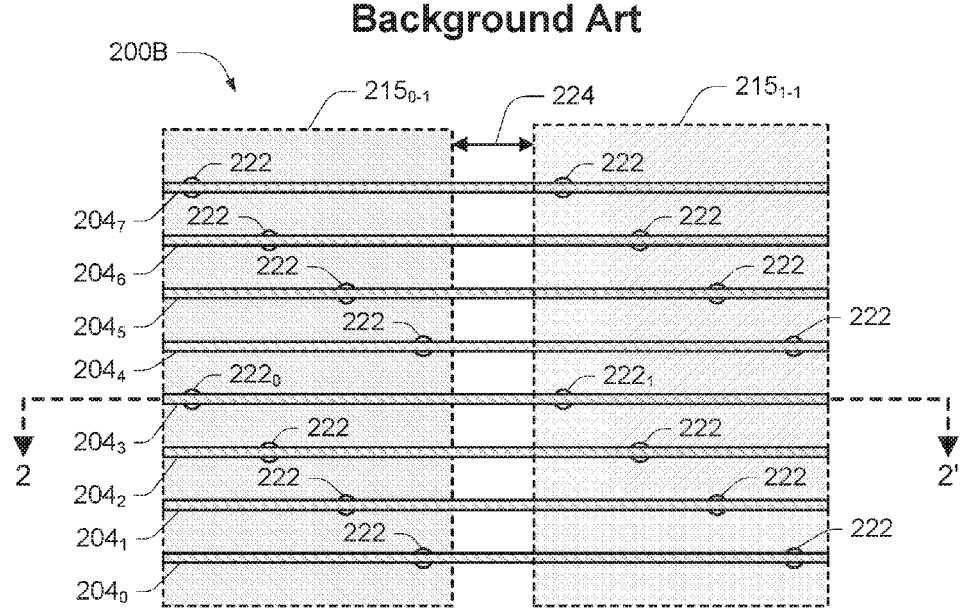
FIG. 2C is a top view of the portion of an array of memory cells of FIG. 2B.

FIG. 2B is a cross-sectional view of a portion of an array of memory cells, e.g., a block of memory cells 200B, as an example of how the schematic of FIG. 2A might guide the formation of a three-dimensional array of memory cells. FIG. 2C is a top view of the portion of an array of memory cells of FIG. 2B. The cross-sectional view of FIG. 2B is taken at line 2-2' of FIG. 2C. The three-dimensional block of memory cells 200B may incorporate semiconductor structures 222 (e.g. vertical semiconductor structures) which may include semiconductor pillars where a portion of a pillar may act as a channel region of the memory cells and select gates.

The block of memory cells 200B might include those memory cells coupled to a common set of word lines 202 (e.g., word lines $202_0$-$202_3$). The block of memory cells 200B might be divided into a number of sub-blocks of memory cells 220 (e.g., sub-blocks of memory cells $220_0$ and $220_1$). The sub-blocks of memory cells 220 (e.g., sub-block of memory cells $220_0$ or $220_1$) might include those memory cells of the block of memory cells 200B formed at intersections of the common set of word lines and a single semiconductor structure 222 (e.g., semiconductor structure $222_0$ or $222_1$, respectively).

As depicted in FIGS. 2B-2C, each sub-block of memory cells 220 (e.g., sub-blocks of memory cells $220_0$ and $220_1$) can be individually connected to its corresponding bit line 204 by applying appropriate voltage levels to select lines 215 (e.g., select lines $215_{0-0}$, $215_{0-1}$, $215_{1-0}$ and $215_{1-1}$) to activate the select gates of one of the sub-blocks of memory cells 220 and to deactivate at least one of the select gates of the other one of the sub-blocks of memory cells 220.

During access of memory cells of the block of memory cells 200B, capacitive coupling of voltages between one set of select lines 215 (e.g., select lines $215_{0-0}$ and $215_{0-1}$) and another set of select lines 215 (e.g., select lines $215_{1-0}$ and $215_{1-1}$) might result in partial activation of select gates intended to be deactivated. This might result in program disturb during a programming operation, or corruption of data during a read operation. To mitigate such capacitive coupling, one set of select lines 215 (e.g., select lines $215_{0-0}$ and $215_{0-1}$) may be laterally separated from the other set of select lines 215 (e.g., select lines $215_{1-0}$ and $215_{1-1}$), thereby providing a region of isolation 224.

Figure 3A:
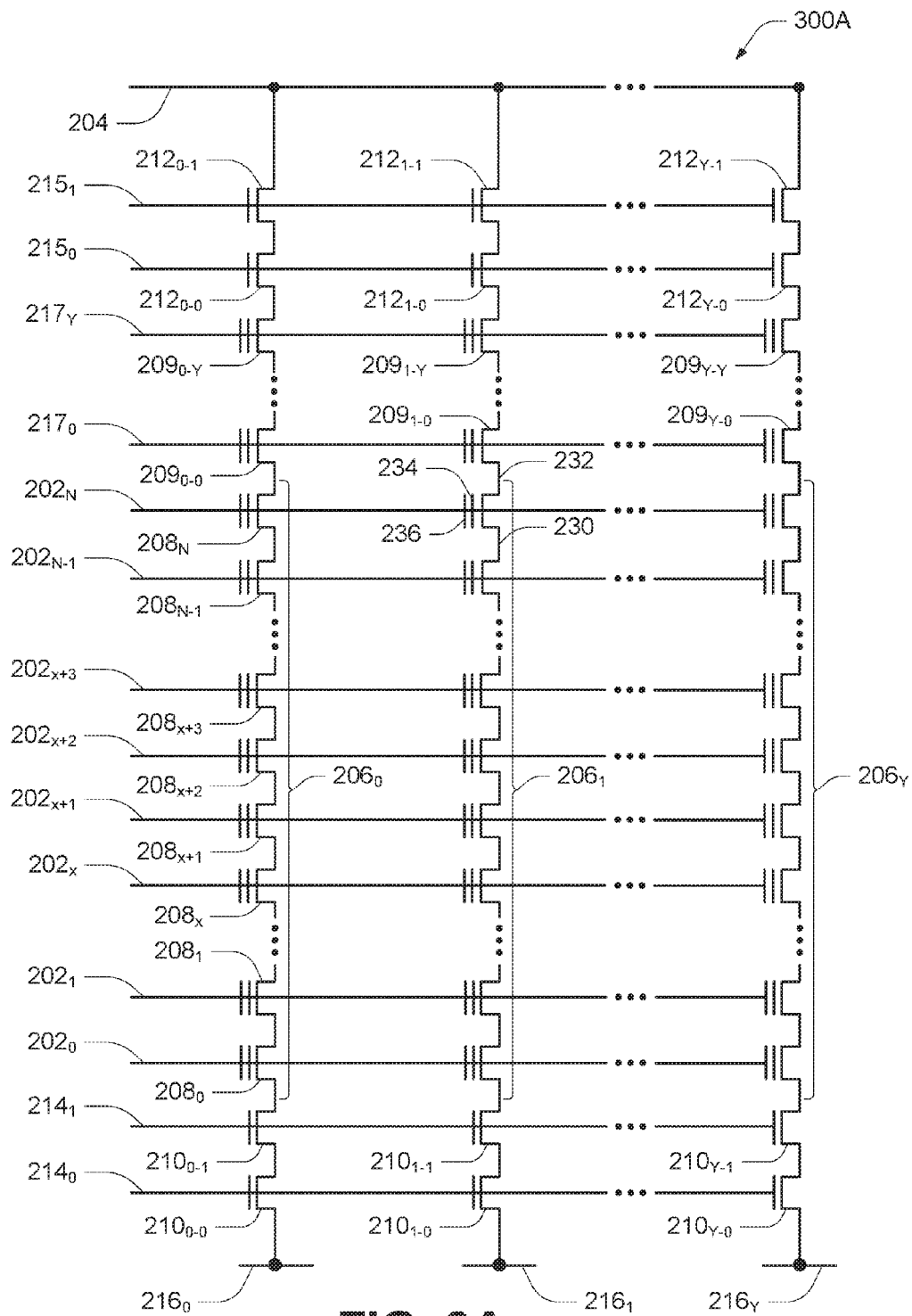
FIG. 3A is a schematic of a portion of an array of memory cells in accordance with an embodiment as could be used in a memory of the type described with reference to FIG. 1.

FIG. 3A is a schematic of a portion of an array of memory cells 300A in accordance with an embodiment as could be used in a memory of the type described with reference to FIG. 1. Memory array 300A includes access lines, such as word lines $202_0$ to $202_N$, and a data line, such as bit line 204. The word lines 202 may be connected to global access lines (e.g., global word lines), not shown in FIG. 3A, in a many-to-one relationship. Memory array 300A might be formed over a semiconductor that, for example, may be conductively doped to have a conductivity type, such as a p-type conductivity, e.g., to form a p-well, or an n-type conductivity, e.g., to form an n-well.

Memory array 300A might include strings of series-connected memory cells, such as one of NAND strings $206_0$ to $206_Y$, where Y is an integer value greater than or equal to 1. It will be apparent from the figure that the NAND strings 206 may be numbered consecutively for each integer value from 0 to Y. In addition, while NAND strings $206_0$, $206_1$ and $206_Y$ are depicted in FIG. 3A, it will be understood that for an example of Y=1, the NAND string $206_1$ and the NAND string $206_Y$ refer to a single (e.g., the same) structure. This guidance applies to remaining elements of the figures similarly numbered.

Each NAND string 206 might be connected (e.g., selectively connected) to a respective source 216 and might include memory cells $208_0$ to $208_N$. The memory cells 208 may represent non-volatile memory cells for storage of data. Some memory cells 208 may further represent non-volatile "dummy" memory cells. One or more dummy memory cells might be provided at the edges of the NAND strings 206, such as at word lines $202_0$ and $202_N$, and may act to reduce disturb effects on remaining memory cells 208 of the NAND strings 206. Dummy memory cells are typically not used to store data accessible to a user of the memory. Alternatively, or in addition, some memory cells 208 of a NAND string 206 might be operated at a lower density than other memory cells 208 of the NAND string 206, e.g., at one bit per memory cell instead of two, to increase their reliability. There may be no intervening memory cells 208 between the edge word lines $202_0$ and $202_N$ and their nearest select gate 210 or 212, respectively.

The memory cells 208 of each NAND string 206 might be connected in series between a select gate 210 (e.g., a field-effect transistor), such as one of the select gates $210_{0-0}$/$210_{0-1}$ to $210_{Y-0}$/$210_{Y-1}$ (e.g., that may be source select transistors, commonly referred to as select gate source), and a select gate 212 (e.g., a field-effect transistor), such as one of the select gates $212_{0-0}$/$212_{0-1}$ to $212_{Y-0}$/$212_{Y-1}$ (e.g., that may be drain select transistors, commonly referred to as select gate drain). Select gates $210_{0-0}$ to $210_{Y-0}$ and select gates $210_{0-1}$ to $210_{Y-1}$ might be commonly connected to respective select lines $214_0$ and $214_1$, respectively, such as source select lines, and select gates $212_{0\text{-}0}$ to $212_{Y\text{-}0}$ and select gates $212_{0\text{-}1}$ to $212_{Y\text{-}1}$ might be connected to respective select lines $215_0$ and $215_1$, respectively, such as drain select lines. Although depicted as traditional field-effect transistors (e.g., lacking a data-storage structure), the select gates 210 and 212 may utilize a structure similar to (e.g., the same as) the memory cells 208 (e.g., including a data-storage structure). Other numbers of select gates 210 may be connected in series between the memory cells 208 of a corresponding NAND string 206 and a source 216. Other numbers of select gates 212 may be connected in series between the memory cells 208 of a corresponding NAND string 206 and the bit line 204.

The memory array 300A may further include two or more select gates 209 connected in series between a NAND string 206 and the bit line 204. For example, select gates $209_{0\text{-}0}$ to $209_{0\text{-}Y}$ are depicted to be connected in series between the NAND string $206_0$ and the bit line 204. The select gates 209 may utilize a structure similar to (e.g., the same as) the memory cells 208.

One select gate 209 connected in series between each NAND string 206 and the bit line 204 may have a threshold voltage adjusted (e.g., programmed and/or erased) to be in a first range of threshold voltages, and each remaining select gate 209 connected in series between those NAND strings 206 and the bit line 204 may have a threshold voltage adjusted (e.g., programmed and/or erased) to be in a second range of threshold voltages that is mutually exclusive to the first range of threshold voltages. The one select gate 209 connected in series between any one of the NAND strings 206 and the bit line 204, and having a threshold voltage in the first range of threshold voltages, may be connected to a select line 217 for which no other select gate 209 connected to that select line 217 has a threshold voltage in the first range of threshold voltages.

Furthermore, for n-type devices, the first range of threshold voltages may be higher than the second range of threshold voltages, such that all of the select gates 209 connected to a particular select line 217 can be activated in response to a particular voltage level (e.g., a voltage level greater than or equal to any value in the first range of threshold voltages), or all of the select gates 209 connected to the particular select line 217 except for the one select gate 209 having a threshold voltage in the first range of threshold voltages can be activated in response to a different voltage level, less than the particular voltage level (e.g., a voltage level greater than or equal to any value in the second range of threshold voltages, and less than any value in the first range of threshold voltages). By configuring the select gates 209 in this manner, as will be explained in more detail infra, one of the NAND strings $206_0\text{-}206_Y$ can be connected to the bit line 204 while each remaining NAND strings $206_0\text{-}206_Y$ can be isolated from the bit line 204.

A source of each select gate $210_{0\text{-}0}$ to $210_{Y\text{-}0}$ might be connected to respective source 216 (e.g., source $216_0$ to $216_Y$). The drain of each select gate $210_{0\text{-}1}$ to $210_{Y\text{-}1}$ might be connected to a memory cell $208_0$ of the corresponding NAND string 206. For example, the drain of select gate $210_{0\text{-}1}$ might be connected to memory cell $208_0$ of the corresponding NAND string $206_0$. Therefore, the select gates 210 might be configured to selectively connect a corresponding NAND string 206 to a source 216. A control gate of each select gate 210 might be connected to a respective select line 214, with each select line 214 isolated from each remaining select line 214.

The drain of each select gate $212_{0\text{-}1}$ to $212_{Y\text{-}1}$ might be connected to the bit line 204. The source of each select gate $209_{0\text{-}0}$ to $209_{Y\text{-}0}$ might be connected to a memory cell $208_N$ of the corresponding NAND string 206. For example, the source of select gate $209_{0\text{-}0}$ might be connected to memory cell $208_N$ of the corresponding NAND string $206_0$. Therefore, the select gates 212 and select gates 209 might collectively be configured to selectively connect a corresponding NAND string 206 to the common bit line 204. A control gate of each select gate 209 might be connected to a respective select line 217, with each select line 217 isolated from each remaining select line 217. A control gate of each select gate 212 might be connected to a respective select line 215, with each select line 215 isolated from each remaining select line 215.

While FIG. 3A depicts the select gates 209 to be connected in series between the select gates 212 and the memory cells 208, such an order is not required. For example, the select gates 212 could be connected in series between the select gates 209 and the memory cells 208. In addition, one or more select gates 209 might be interposed between select gates 212 or vice versa. For some embodiments, the select gates 209 are connected in series between the memory cells 208 and any select gate 212 to be operated in a mode to assist GIDL (gate induced drain leakage) during an erase operation on the array of memory cells. In addition, the use of the select gates 209 as described herein may facilitate a reduction in a number of select gates 212, or even their elimination.

The memory array in FIG. 3A might represent a three-dimensional memory array, e.g., where NAND strings 206 may extend substantially perpendicular to a plane containing the sources 216 and to a plane containing a plurality of bit lines 204 that may be substantially parallel to the plane containing the sources 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 3A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to a word line 202. As it is often the case that formation of a word line 202 also forms the corresponding control gates 236, such formation will be deemed to be a connection of those control gates 236 to their corresponding word line 202. This concept can hold true for the formation of select lines (e.g., select lines 214, 215 and 217) as well.

Figure 3B:
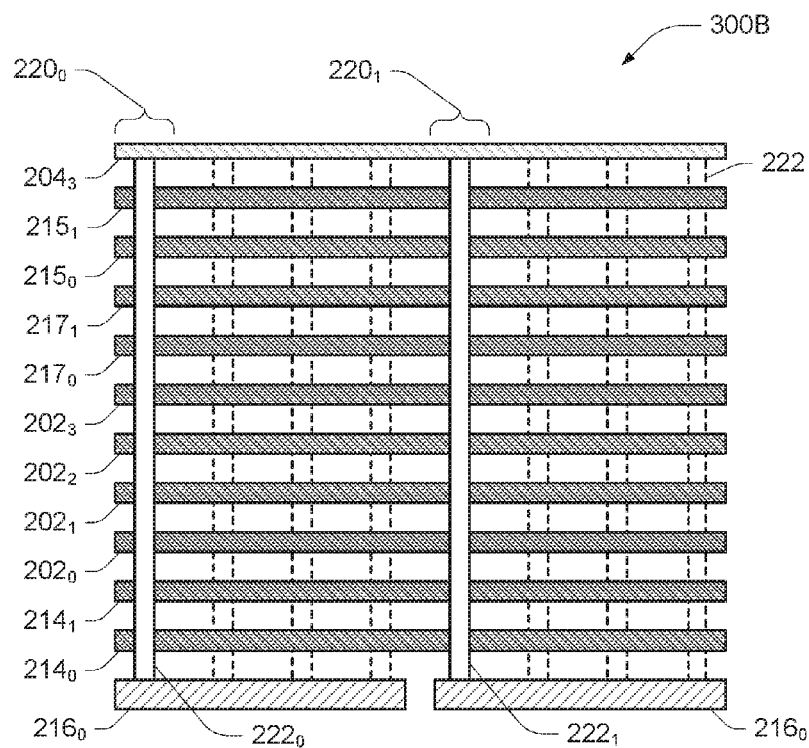
FIG. 3B is a cross-sectional view of a portion of an array of memory cells in accordance with an embodiment of how the schematic of FIG. 3A might be used to form a three-dimensional array of memory cells.
Figure 3C:
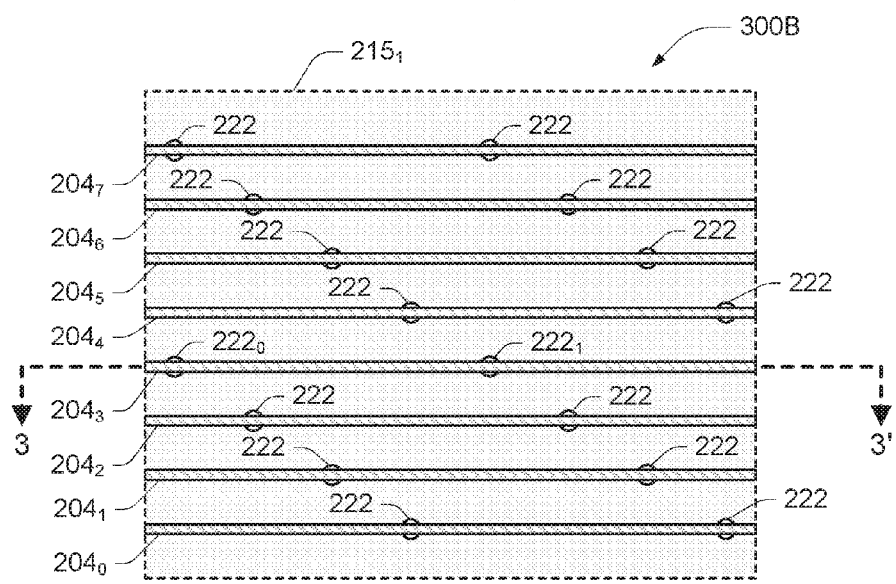
FIG. 3C is a top view of the portion of an array of memory cells of FIG. 3B.

FIG. 3B is a cross-sectional view of a portion of an array of memory cells, e.g., a block of memory cells 300B, in accordance with an embodiment of how the schematic of FIG. 3A might be used to form a three-dimensional array of memory cells. FIG. 3C is a top view of the portion of an array of memory cells of FIG. 3B. The cross-sectional view of FIG. 3B is taken at line 3-3' of FIG. 3C. The three-dimensional block of memory cells 300B may incorporate semiconductor structures 222 (e.g. vertical semiconductor structures) which may include semiconductor pillars where a portion of a pillar may act as a channel region of the memory cells and select gates.

The block of memory cells 300B might include those memory cells coupled to a common set of word lines 202 (e.g., word lines $202_0\text{-}202_3$). The block of memory cells 300B might be divided into a number of sub-blocks of memory cells 220 (e.g., sub-blocks of memory cells $220_0$ and $220_1$). The sub-blocks of memory cells 220 (e.g., sub-block of memory cells $220_0$ or $220_1$) might include those memory cells of the block of memory cells 300B formed at intersections of the common set of word lines and a single semiconductor structure 222 (e.g., semiconductor structure $222_0$ or $222_1$, respectively).

As depicted in FIGS. 3B-3C, each sub-block of memory cells 220 (e.g., sub-blocks of memory cells $220_0$ and $220_1$) can be individually connected to its corresponding bit line 204 (e.g., bit line $204_3$) by applying appropriate voltage levels to select lines 215 and 217 (e.g., select lines $215_0$, $215_1$, $217_0$ and $217_1$) to activate the select gates (e.g., select gates 212 and 209 of FIG. 3A) of one of the sub-blocks of memory cells 220 and to deactivate at least one of the select gates of the other one of the sub-blocks of memory cells 220.

As an example, voltage levels could be applied to select lines $215_0$ and $215_1$ sufficient to activate all of the select gates connected to those select lines (e.g., select gates $212_{0-0}$ to $212_{Y-0}$ and select gates $212_{0-1}$ to $212_{Y-1}$ depicted in FIG. 3A, where Y=1), a voltage level could be applied to one of the select lines 217 (e.g., select line $217_0$) sufficient to activate all of the select gates connected to that select line (e.g., select gates $209_{0-0}$ to $209_{Y-0}$ depicted in FIG. 3A, where Y=1), and a voltage level could be applied to the other one of the select lines 217 (e.g., select line $217_1$) sufficient to activate all of the select gates connected to that select line (e.g., select gates $209_{0-Y}$ to $209_{Y-Y}$ depicted in FIG. 3A, where Y=1) except for any select gate 209 having its threshold voltage in the first range of threshold voltages.

Figure 3D:
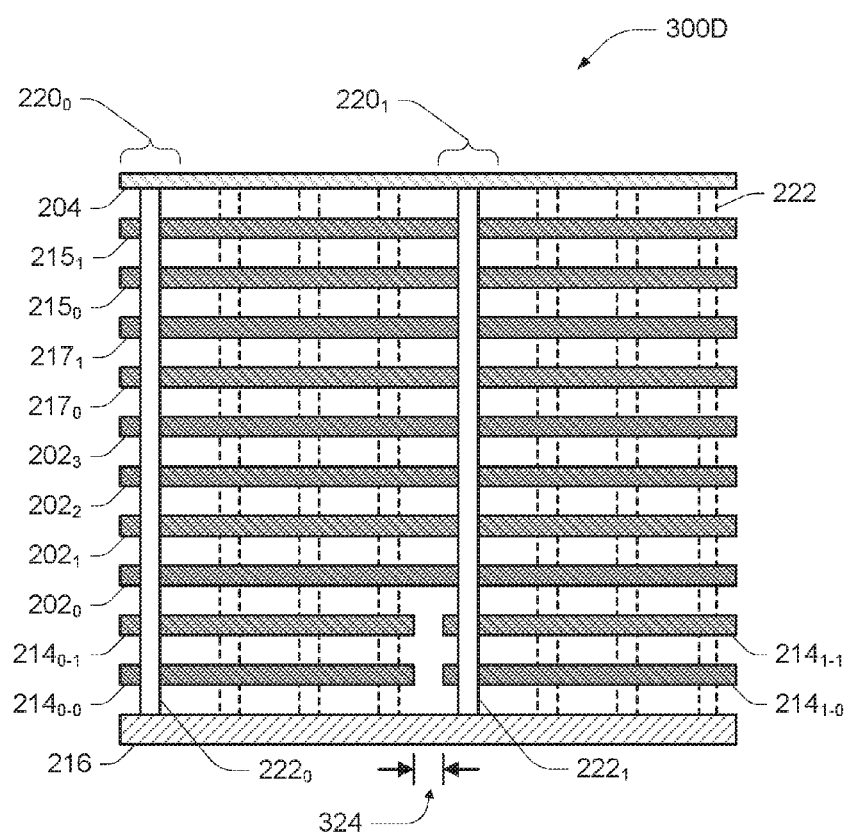
FIG. 3D is a cross-sectional view of a portion of an array of memory cells in accordance with another embodiment.

Although each sub-block of memory cells 220 described with reference to FIGS. 3A-3C and connected to a particular bit line 204 is depicted to be selectively connected to a separate source 216, other options are available to provide different source connectivity. FIG. 3D is a cross-sectional view of a portion of an array of memory cells in accordance with another embodiment providing separate connections of sub-blocks of memory cells to a common source.

The structure of FIG. 3D differs from the structure of FIG. 3C in providing separate source select lines 214 (e.g., source select lines $214_{0-0}/214_{0-1}$ and $214_{1-0}/214_{1-0}$ for the different sub-blocks of memory cells 220 (e.g., sub-block of memory cells $220_0$ and $220_1$, respectively) for individual connection to a common source 216. While a lateral separation of the select lines 214 of FIG. 3D might be utilized to facilitate a region of isolation 324, the region of isolation 324 between separated select lines 214 of FIG. 3D might represent a smaller lateral distance than the region of isolation 224 between separated select lines 215 of FIGS. 2B-2C. In particular, because separate connections to a source 216 may only be necessary during programming of the select gates associated with the select lines 217 (e.g., select gates 209 of FIG. 3A), the concerns regarding corruption of read data might be eliminated, and the concerns regarding program disturb might be mitigated as the programming of select gates 209 may be less critical than programming of memory cells 208.

Figure 3E:
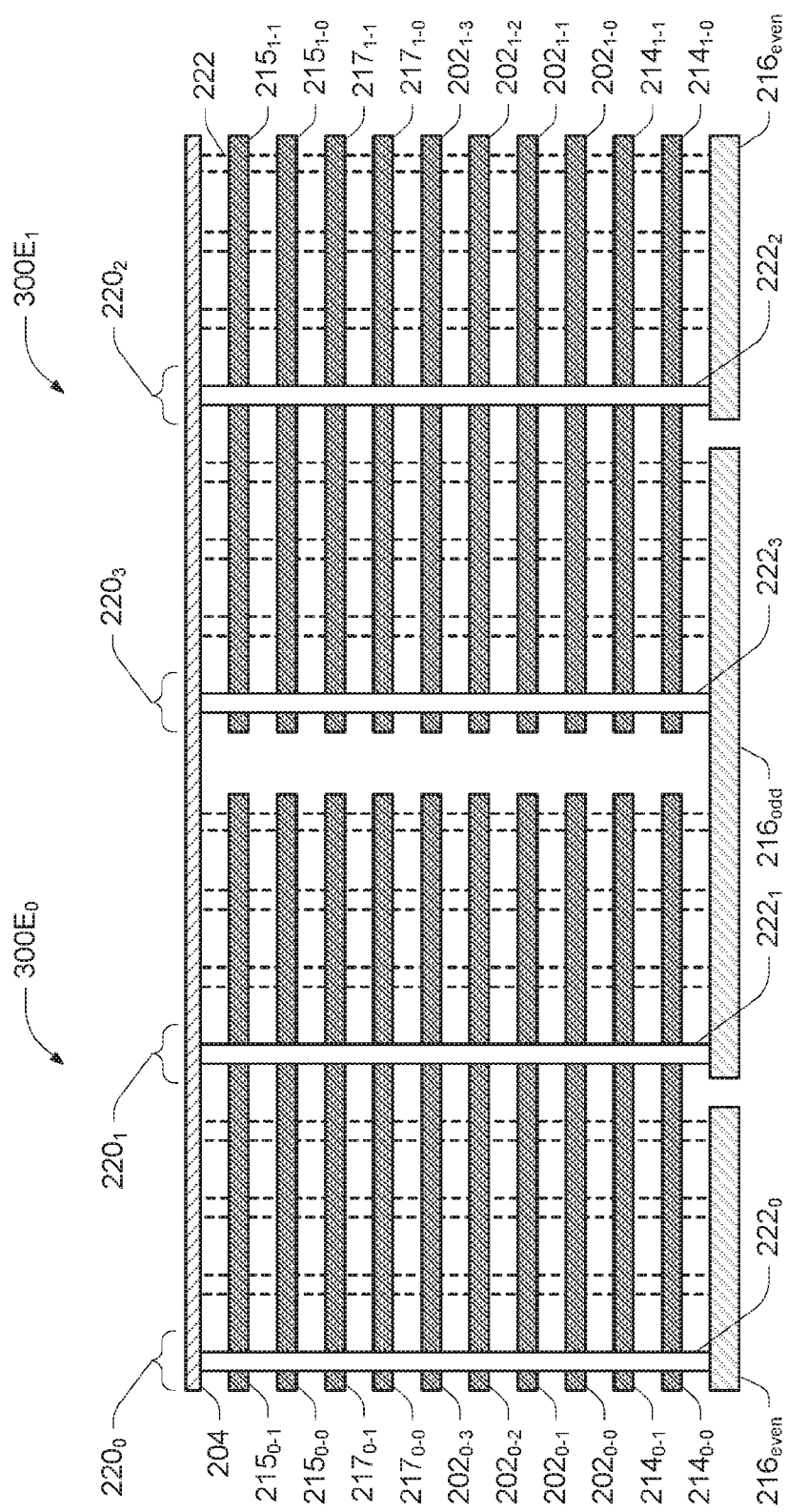
FIG. 3E is a cross-sectional view of a portion of an array of memory cells in accordance with another embodiment.

FIG. 3E is a cross-sectional view of a portion of an array of memory cells in accordance with another embodiment as a variation of the embodiment of FIGS. 3B-3C depicting how two different blocks of memory (e.g., blocks of memory cells $300E_0$ and $300E_1$) might share a source 216 for a portion of their sub-blocks 220. For example, the sub-block of memory cells $220_1$ of block of memory cells $300E_0$ and the sub-block of memory cells $220_3$ of block of memory cells $300E_1$ might share a source $216_{odd}$, while source $216_{even}$ of the sub-block of memory cells $220_0$ of block of memory cells $300E_0$ might be separated from the source $216_{even}$ of the sub-block of memory cells $220_2$ of block of memory cells $300E_1$. Note that, although separated, the source $216_{even}$ of the sub-block of memory cells $220_0$ of block of memory cells $300E_0$ and the source $216_{even}$ of the sub-block of memory cells $220_2$ of block of memory cells $300E_1$ might be electrically connected or otherwise operated to receive the same voltage signals.

Figure 4A:
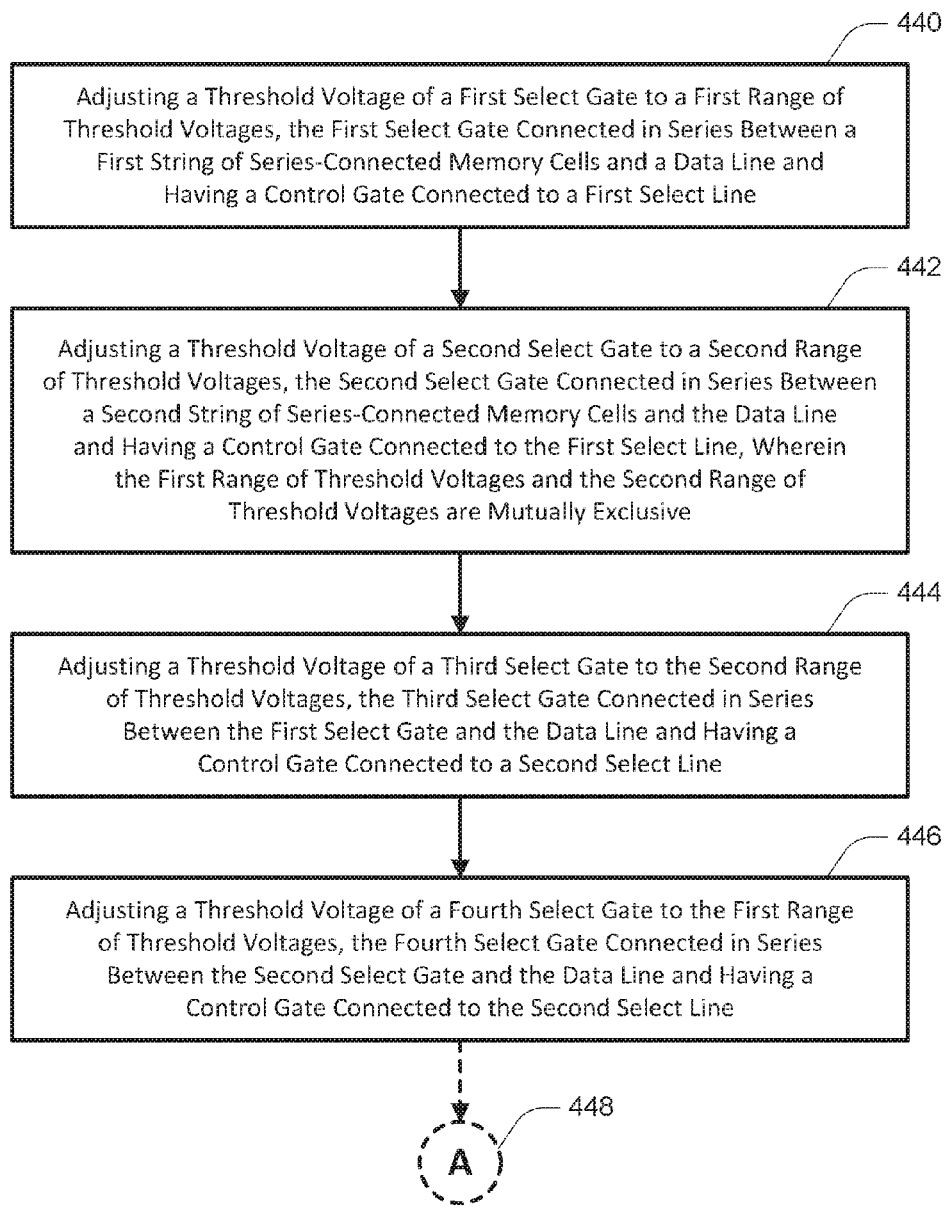
FIG. 4A is a flowchart of a method of operating a memory in accordance with an embodiment.

FIG. 4A is a flowchart of a method of operating a memory in accordance with an embodiment. At 440, a threshold voltage of a first select gate is adjusted to a first range of threshold voltages, the first select gate connected in series between a first string of series-connected memory cells and a data line and having a control gate connected to a first select line. For example, and with reference to FIG. 3A, consider the case where Y=1 and the first range of threshold voltages having a nominal (e.g., target) value of 4V, e.g., a range of 4.0V-4.5V. In this example, the threshold voltage of select gate $209_{0-0}$ connected in series between NAND string $206_0$ and the bit line 204, and having its control gate connected to select line $217_0$, might be adjusted (e.g., programmed) using the target value of 4V, such that upon completion of the programming operation, the threshold voltage of select gate $209_{0-0}$ might have a value of at least 4V. Programming of the threshold voltage of select gate $209_{0-0}$ might be accomplished by applying a voltage level across the data-storage structure 234 sufficient to increase the threshold voltage of the select gate $209_{0-0}$.

For example, a programming pulse having a voltage level of 20V might be applied to the select line $217_0$; a pass voltage (e.g., 10V) might be applied to all remaining select line(s) 217 (e.g., select line $217_1$) and all word lines 202 (e.g., word lines $202_0$-$202_N$) to activate their respective select gate(s) 209 and memory cells 208 associated with NAND string $206_0$ (e.g., select gate $209_{0-1}$ and memory cells $208_0$-$208_N$ of NAND string $206_0$); a voltage level suitable to enable programming in view of the programming pulse might be applied to the source $216_0$ (e.g., a reference potential such as ground, Vss or 0V); a voltage level (e.g., Vcc) sufficient to activate the select gate(s) 210 associated with NAND string $206_0$ (e.g., select gates $210_{0-0}$ and $210_{0-1}$) might be applied to the select line(s) 214 (e.g., select lines $214_0$ and $214_1$); and a voltage level (e.g., the reference potential) sufficient to deactivate any select gate(s) 212 associated with NAND string $206_0$ (e.g., select gates $212_{0-0}$ and $212_{0-1}$) might be applied to any select line(s) 215 (e.g., select lines $215_0$ and $215_1$). In addition, a voltage level (e.g., Vcc) might be applied to the source $216_1$ sufficient to deactivate the select gate(s) 210 associated with NAND string $206_1$ (e.g., select gates $210_{1-0}$ and $210_{1-1}$), thus inhibiting programming of the select gate 209 (e.g., select gates $209_{1-0}$) associated with NAND string $206_1$. The bit line 204 might be allowed to float during the programming operation. As is understood in the art, following application of the programming pulse, a verify operation may be performed to determine if the threshold voltage of the select gate $209_0$ has reached the target value, and an additional, higher, programming pulse may be similarly applied if the target value has not been reached. Other methods of increasing the threshold voltage of a select gate having a data-storage structure might be used, including programming operations that utilize stepped or ramped programming pulses.

At 442, a threshold voltage of a second select gate is adjusted to a second range of threshold voltages, the second select gate connected in series between a second string of series-connected memory cells and the data line and having a control gate connected to the first select line, wherein the first range of threshold voltages and the second range of threshold voltages are mutually exclusive. Continuing with the above example, consider the case where the second range of threshold voltages is less than the first range of threshold voltages. In this example, the threshold voltage of select gate $209_{1\text{-}0}$ connected in series between NAND string $206_1$ and the bit line 204, and having its control gate connected to select line $217_0$, might be adjusted (e.g., programmed) using a nominal (e.g., target) value less than 4V in a manner such as described with reference to the programming of select gate $209_{0\text{-}0}$ by merely swapping the voltage levels applied to their respective sources 216 and verifying to the lower target value. Alternatively, the threshold voltage of select gate $209_{1\text{-}0}$ might be adjusted during an erase operation preceding the programming of the select gate $209_{0\text{-}0}$, such that its threshold voltage might have a nominal value of 0V, e.g., a range of −0.5-0V.

At 444, a threshold voltage of a third select gate is adjusted to the second range of threshold voltages, the third select gate connected in series between the first select gate and the data line and having a control gate connected to a second select line. In this example, the threshold voltage of select gate $209_{0\text{-}1}$ connected in series between NAND string $206_0$ and the bit line 204, and having its control gate connected to select line $217_1$, might be adjusted (e.g., programmed) using a target value less than 4V in a manner such as described with reference to the programming of select gate $209_{0\text{-}0}$ by merely swapping the voltage levels applied to their respective select lines 217. Alternatively, the threshold voltage of select gate $209_{0\text{-}1}$ might be adjusted during an erase operation preceding the programming of the select gate $209_{0\text{-}0}$, such that its threshold voltage might have a nominal value of 0V, e.g., a range of −0.5-0V.

At 446, a threshold voltage of a fourth select gate is adjusted to the first range of threshold voltages, the fourth select gate connected in series between the second select gate and the data line and having a control gate connected to the second select line. In this example, the threshold voltage of select gate $209_{1\text{-}1}$ connected in series between NAND string $206_1$ and the bit line 204, and having its control gate connected to select line $217_1$, might be adjusted (e.g., programmed) using the target value of 4V in a manner such as described with reference to the programming of select gate $209_{0\text{-}0}$ by merely swapping the voltage levels applied to their respective select lines 217 and swapping the voltage levels applied to their respective sources 216.

Figure 4B:
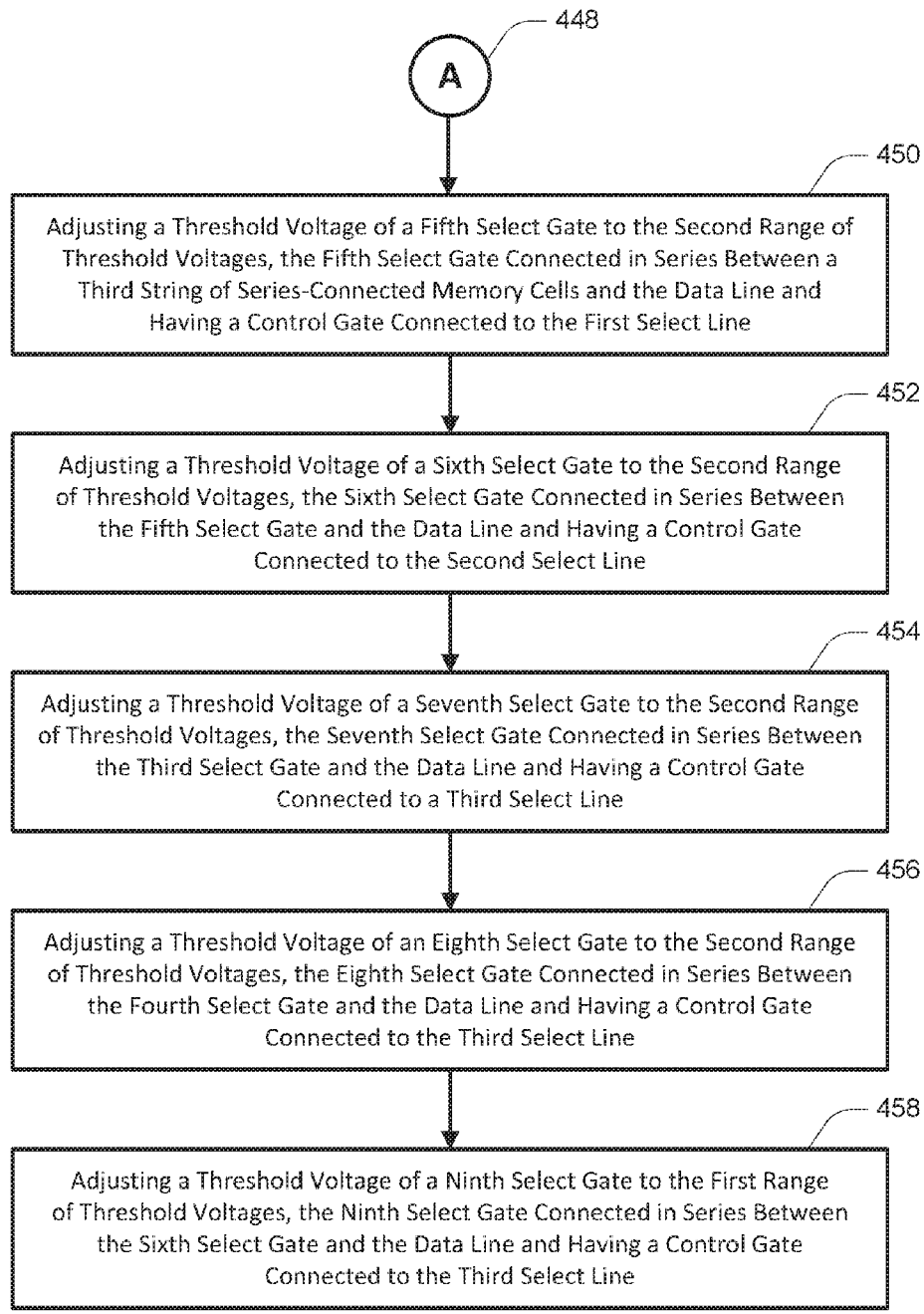
FIG. 4B is a flowchart of a method of operating a memory in accordance with a further embodiment as an extension of the embodiment of FIG. 4A.

While the foregoing description of the method of FIG. 4A may describe the adjustment of threshold voltages of the select gates 209 using a structure such as depicted in FIG. 3A when Y=1, the method of FIG. 4A may be extended to examples where Y>1 (e.g., Y=2) by continuing the flowchart at 448 with reference to FIG. 4B.

FIG. 4B is a flowchart of a method of operating a memory in accordance with a further embodiment as an extension of the embodiment of FIG. 4A. Continuing from 448, at 450, a threshold voltage of a fifth select gate (e.g., select gate $209_{2\text{-}0}$) is adjusted to the second range of threshold voltages, the fifth select gate connected in series between a third string of series-connected memory cells (e.g., NAND string $206_2$) and the data line and having a control gate connected to the first select line. At 452, a threshold voltage of a sixth select gate (e.g., select gate $209_{2\text{-}1}$) is adjusted to the second range of threshold voltages, the sixth select gate connected in series between the fifth select gate and the data line and having a control gate connected to the second select line. At 454, a threshold voltage of a seventh select gate (e.g., select gate $209_{0\text{-}2}$) is adjusted to the second range of threshold voltages, the seventh select gate connected in series between the third select gate and the data line and having a control gate connected to a third select line (e.g., select line $217_2$). At 456, a threshold voltage of an eighth select gate (e.g., select gate $209_{1\text{-}2}$) to the second range of threshold voltages, the eighth select gate connected in series between the fourth select gate and the data line and having a control gate connected to the third select line. At 458 adjusting a threshold voltage of a ninth select gate (e.g., select gate $209_{2\text{-}2}$) to the first range of threshold voltages, the ninth select gate connected in series between the sixth select gate and the data line and having a control gate connected to the third select line. It will be readily apparent that the method of FIGS. 4A and 4B could be extended to examples where Y>2.

FIG. 5 is a flowchart of a method of operating a memory in accordance with another embodiment. At 560, the respective threshold voltages of each select gate of a first plurality of select gates (e.g., select gates $209_{0\text{-}0}$ to $209_{0\text{-}Y}$) connected in series between a first string of series-connected memory cells (e.g., NAND string $206_0$) and a data line (e.g., bit line 204) are adjusted such that one select gate (e.g., select gate $209_{0\text{-}0}$) of the first plurality of select gates has its respective threshold voltage in a first range of threshold voltages, and each remaining select gate of the first plurality of select gates has its respective threshold voltage in a second range of threshold voltages, wherein the first range of threshold voltages and the second range of threshold voltages are mutually exclusive.

At 562, the respective threshold voltages of each select gate of a second plurality of select gates (e.g., select gates $209_{1\text{-}0}$ to $209_{1\text{-}Y}$) connected in series between a second string of series-connected memory cells (e.g., NAND string $206_1$) and a data line (e.g., bit line 204) are adjusted such that one select gate (e.g., select gate $209_{1\text{-}1}$) of the second plurality of select gates has its respective threshold voltage in the first range of threshold voltages, and each remaining select gate of the second plurality of select gates has its respective threshold voltage in the second range of threshold voltages, wherein each select gate of the first plurality of select gates shares a select line (e.g., select lines $217_0$-$217_Y$) with a respective select gate of the second plurality of select gates, and wherein the select line (e.g., select line $217_0$) of the one select gate (e.g., $209_{0\text{-}0}$) of the first plurality of select gates is isolated from the select line (e.g., select line $217_1$) of the one select gate (e.g., select gate $209_{1\text{-}1}$) of the second plurality of select gates.

The method of FIG. 5 may optionally continue to 564 for cases where Y>=2. At 564, the respective threshold voltages of each select gate of a third plurality of select gates (e.g., select gates $209_{2\text{-}0}$ to $209_{2\text{-}Y}$) connected in series between a third string of series-connected memory cells (e.g., NAND string $206_2$) and a data line (e.g., bit line 204) are adjusted such that one select gate (e.g., select gate $209_{2\text{-}2}$) of the third plurality of select gates has its respective threshold voltage in the first range of threshold voltages, and each remaining select gate of the third plurality of select gates has its respective threshold voltage in the second range of threshold voltages, wherein each select gate of the third plurality of select gates shares a select line (e.g., select lines $217_0$-$217_Y$) with a respective select gate of the first plurality of select gates and with a respective select gate of the second plurality of select gates, and wherein the select line (e.g., select line $217_2$) of the one select gate (e.g., $209_{2\text{-}2}$) of the third plurality of select gates is isolated from the select line (e.g., select line $217_0$) of the one select gate (e.g., $209_{0\text{-}0}$) of the first plurality of select gates and from the select line (e.g., select line $217_1$) of the one select gate (e.g., select gate $209_{1\text{-}1}$) of the second plurality of select gates.

Figure 6A:
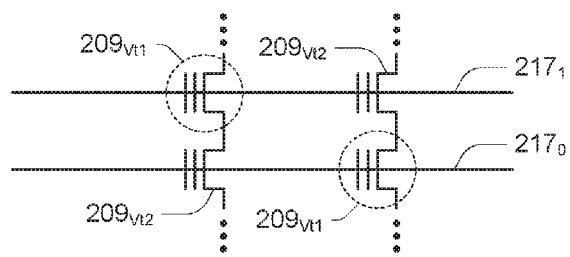
FIGS. 6A-6C are schematics demonstrating the use of mutually exclusive ranges of threshold voltages for select gates in accordance with embodiments.
Figure 6B:
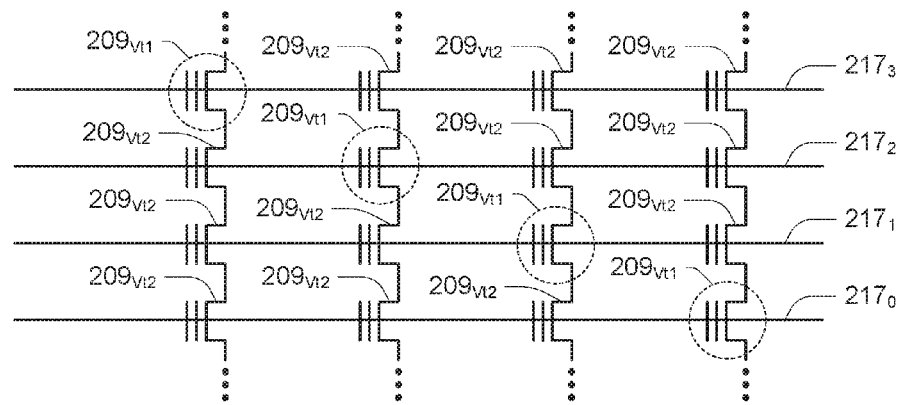
Figure 6C:
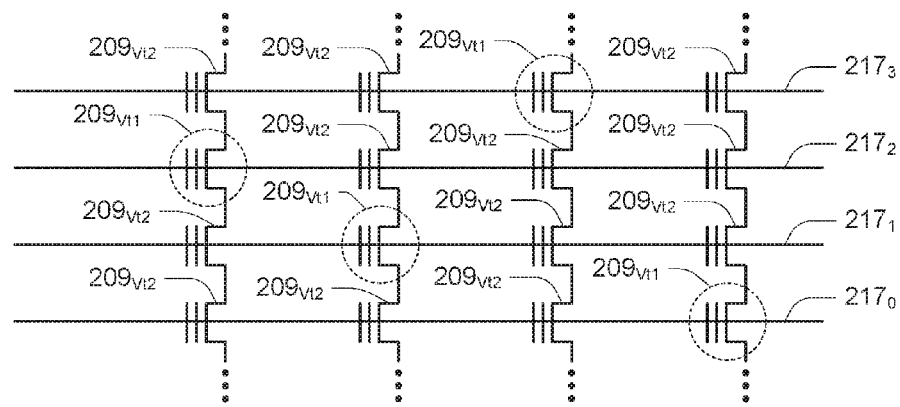

FIGS. 6A-6C are schematics demonstrating the use of mutually exclusive ranges of threshold voltages for the select gates 209 in accordance with embodiments. FIG. 6A depicts an example where Y=1. FIGS. 6B and 6C depict examples where Y=3. In each case, the select gates $209_{Vt1}$ (e.g., those circled in dashed line) are adjusted to have a threshold voltage in a first range of threshold voltages, while the remaining select gates $209_{Vt2}$ are adjusted to have a threshold voltage in a second range of threshold voltages that is mutually exclusive to the first range of threshold voltages. The Example of FIG. 6C demonstrates that the selection of which select gate 209 in a plurality of series-connected select gates 209 is adjusted to have a threshold voltage in the first range of threshold voltages is flexible.

Figure 7:
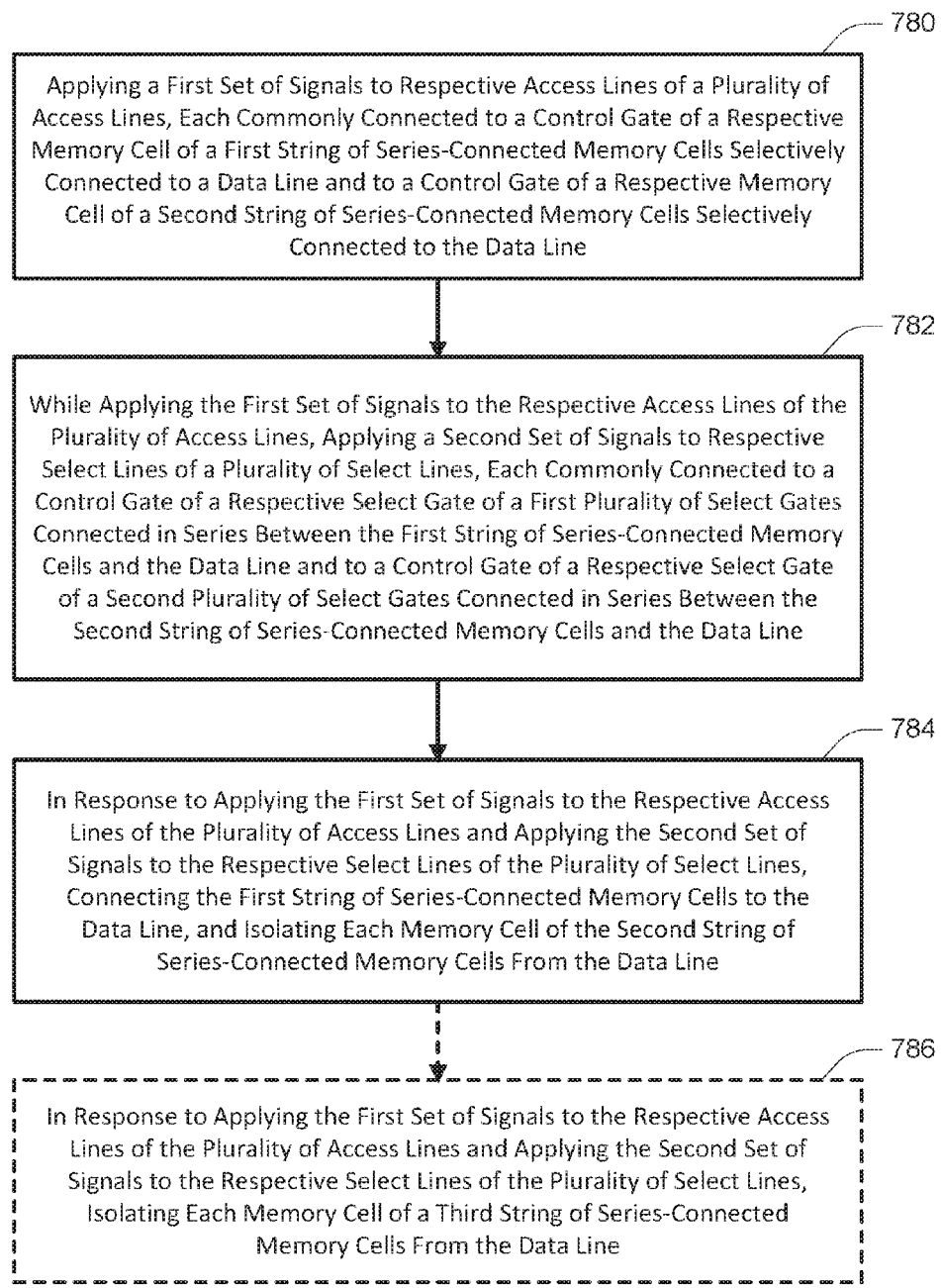
FIG. 7 is a flowchart of a method of operating a memory in accordance with an embodiment.

FIG. 7 is a flowchart of a method of operating a memory in accordance with an embodiment. The method of FIG. 7 will be described with reference to the structure of FIG. 3A. At 780, a first set of signals (e.g., voltage levels) is applied to respective access lines of a plurality of access lines (e.g., word lines $202_0$-$202_N$), each commonly connected to a control gate of a respective memory cell of a first string of series-connected memory cells (e.g., NAND string $206_0$) selectively connected to a data line (e.g., bit line 204) and to a control gate of a respective memory cell of a second string of series-connected memory cells (e.g., NAND string $206_1$) selectively connected to the data line. The first set of signals may be voltage levels selected for a read operation of a memory cell of the first string of series-connected memory cells. Alternatively, the first set of signals may be voltage levels selected for a programming operation of a memory cell of the first string of series-connected memory cells.

At 782, while applying the first set of signals to the respective access lines of the plurality of access lines, a second set of signals (e.g., voltage levels) is applied to respective select lines of a plurality of select lines (e.g., select lines $215_0$-$215_1$ and select lines $217_0$-$217_Y$), each commonly connected to a control gate of a respective select gate of a first plurality of select gates (e.g., select gates $212_{0\text{-}0}$ and $212_{0\text{-}1}$, and select gates $209_{0\text{-}0}$ to $209_{0\text{-}Y}$) connected in series between the first string of series-connected memory cells and the data line and to a control gate of a respective select gate of a second plurality of select gates (e.g., select gates $212_{1\text{-}0}$ and $212_{1\text{-}1}$, and select gates $209_{1\text{-}0}$ to $209_{1\text{-}Y}$) connected in series between the second string of series-connected memory cells and the data line.

At 784, in response to applying the first set of signals to the respective access lines of the plurality of access lines and applying the second set of signals to the respective select lines of the plurality of select lines, the first string of series-connected memory cells is connected to the data line, and each memory cell of the second string of series-connected memory cells is isolated from the data line. Consider an example where Y=1, select gates $209_{0\text{-}0}$ and $209_{1\text{-}1}$ have threshold voltages in a first range of threshold voltages having a nominal value of 4V, and select gates $209_{0\text{-}1}$ and $209_{1\text{-}0}$ have threshold voltages in a second range of threshold voltages having a nominal value of 0V. Voltage levels could be applied to select lines $215_0$ and $215_1$ sufficient to activate the select gates $212_{0\text{-}0}$, $212_{0\text{-}1}$, $212_{1\text{-}0}$ and $212_{1\text{-}1}$. A voltage level (e.g., 6V) sufficient to activate all select gates 209 could be applied to the select line $217_0$, while a voltage level (e.g., 2V) sufficient to activate only those select gates 209 having a threshold voltage in the second range of threshold voltages could be applied to the select line $217_1$. In this manner, NAND string $206_0$ could be connected to the bit line 204 for reading or programming one of its memory cells, while the memory cells of NAND string $206_1$ could be isolated from the bit line 204 due to deactivation of the select gate $209_{1\text{-}1}$.

For cases where Y>1 (e.g., Y=2), the method of FIG. 7 could continue. For example, the plurality of access lines might be further commonly connected to a control gate of a respective memory cell of a third string of series-connected memory cells (e.g., NAND string $206_Y$ might represent NAND string $206_2$). At 786, in response to applying the first set of signals to the respective access lines of the plurality of access lines and applying the second set of signals to the respective select lines of the plurality of select lines, each memory cell of a third string of series-connected memory cells (e.g., NAND string $206_2$) is isolated from the data line. For example, three select gates 209 could be connected in series between each of the first, second and third strings of series-connected memory cells and the data line. Voltage levels could be applied to their respective select lines 217 to activate all of the select gates 209 between the first string of series-connected memory cells and the data line, while concurrently deactivating at least one (e.g., one) of the select gates 209 between the second string of series-connected memory cells and the data line and at least one (e.g., one) of the select gates 209 between the third string of series-connected memory cells and the data line. As described herein, through the incorporation of additional select gates 209, the method of claim 7 can be further extended for values of Y>2.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
    a first string of series-connected memory cells;
    a second string of series-connected memory cells;
    a third string of series-connected memory cells;
    a first select gate connected in series between the first string of series-connected memory cells and a data line and having a control gate connected to a first select line;
    a second select gate connected in series between the second string of series-connected memory cells and the data line and having a control gate connected to the first select line;
    a third select gate connected in series between the third string of series-connected memory cells and the data line and having a control gate connected to the first select line;
    a fourth select gate connected in series between the first select gate and the data line and having a control gate connected to a second select line;
    a fifth select gate connected in series between the second select gate and the data line and having a control gate connected to the second select line;
    a sixth select gate connected in series between the third select gate and the data line and having a control gate connected to the second select line; a seventh select gate connected in series between the fourth select gate and the data line and having a control gate connected to a third select line;

an eighth select gate connected in series between the fifth select gate and the data line and having a control gate connected to the third select line; and
a ninth select gate connected in series between the sixth select gate and the data line and having a control gate connected to the third select line;
wherein the first select gate, the fifth select gate and the ninth select gate each have a threshold voltage within a first range of threshold voltages; and
wherein the second select gate, the third select gate, the fourth select gate, the sixth select gate, the seventh select gate and the eighth select gate each have a threshold voltage within a second range of threshold voltages mutually exclusive from the first range of threshold voltages.

2. The apparatus of claim 1, wherein the first range of threshold voltages is higher than the second range of threshold voltages.

3. The apparatus of claim 1, wherein the first select gate, the second select gate, the third select gate, the fourth select gate, the fifth select gate, the sixth select gate, the seventh select gate, the eighth select gate, and the ninth select gate each comprise a data-storage structure.

4. The apparatus of claim 1, wherein the first string of series-connected memory cells is selectively connected to a first source, wherein the second string of series-connected memory cells is selectively connected to a second source, and wherein the first source is isolated from the second source.

5. The apparatus of claim 1, wherein the first string of series-connected memory cells and the second string of series-connected memory cells are each selectively connected to a common source.

6. The apparatus of claim 1, further comprising one or more additional select gates connected in series between the first string of series-connected memory cells and the data line, one or more additional select gates connected in series between the second string of series-connected memory cells and the data line, and one or more additional select gates connected in series between the third string of series-connected memory cells and the data line, wherein each additional select gate connected in series between the first string of series-connected memory cells and the data line has a control gate connected to a respective select line that is also connected to a control gate of a respective one of the additional select gates connected in series between the second string of series-connected memory cells and the data line and to a control gate of a respective one of the additional select gates connected in series between the third string of series-connected memory cells and the data line.

7. The apparatus of claim 6, wherein one of the additional select gates is connected in series between the first string of series-connected memory cells and the data line at a location selected from a group consisting of a location between the seventh select gate and the data line, a location between the first select gate and the fourth select gate, a location between the fourth select gate and the seventh select gate, and a location between the first select gate and the first string of series-connected memory cells.

8. The apparatus of claim 1, wherein the third string of series-connected memory cells is interposed between the first string of series-connected memory cells and the second string of series-connected memory cells.

9. The apparatus of claim 1, further comprising:
a fourth string of series-connected memory cells;
a tenth select gate connected in series between the fourth string of series-connected memory cells and the data line and having a control gate connected to the first select line;
an eleventh select gate connected in series between the tenth select gate and the data line and having a control gate connected to the second select line;
a twelfth select gate connected in series between the eleventh select gate and the data line and having a control gate connected to the third select line;
a thirteenth select gate connected in series between the seventh select gate and the data line and having a control gate connected to a fourth select line;
a fourteenth select gate connected in series between the eighth select gate and the data line and having a control gate connected to the fourth select line;
a fifteenth select gate connected in series between the ninth select gate and the data line and having a control gate connected to the fourth select line; and
a sixteenth select gate connected in series between the twelfth select gate and the data line and having a control gate connected to the fourth select line;
wherein the sixteenth select gate has a threshold voltage within the first range of threshold voltages; and
wherein the tenth select gate, the eleventh select gate, the twelfth select gate, the thirteenth select gate, the fourteenth select gate and the fifteenth select gate each have a threshold voltage within the second range of threshold voltages.

10. An apparatus, comprising:
a plurality of strings of series-connected memory cells, each of the plurality of strings of series-connected memory cells having a respective plurality of select gates connected in series between that string of series-connected memory cells and a common data line, and each of the plurality of strings of series-connected memory cells selectively connected to a respective source;
wherein one select gate of each of the pluralities of select gates has a threshold voltage within a first range of threshold voltages, and each remaining select gate of each of the pluralities of select gates has a threshold voltage within a second range of threshold voltages mutually exclusive from the first range of threshold voltages;
wherein each of the pluralities of select gates shares a common set of select lines, with each select line of the common set of select lines connected to a control gate of a respective select gate for each of the pluralities of select gates; and
wherein the one select gate having its threshold voltage within the first range of threshold voltages for any one of the pluralities of select gates has its control gate isolated from the one select gate having its threshold voltage within the first range of threshold voltages for each remaining one of the pluralities of select gates.

11. The apparatus of claim 10, further comprising, for each of the plurality of strings of series-connected memory cells, one or more additional select gates connected in series between that string of series-connected memory cells and the common data line.

12. The apparatus of claim 11, wherein, for a particular string of series-connected memory cells, a particular additional select gate of the one or more additional select gates is connected in series between the particular string of series-connected memory cells and the common data line at a location selected from a group consisting of a location between the respective plurality of select gates and the data line, a location between select gates of the respective plurality of select gates, and a location between the respective plurality of select gates and the particular string of series-connected memory cells.

13. The apparatus of claim 10, wherein each threshold voltage within the first range of threshold voltages is greater than each threshold voltage within the second range of threshold voltages.

14. A method of operating a memory, comprising:
adjusting a threshold voltage of a first select gate to a first range of threshold voltages, the first select gate connected in series between a first string of series-connected memory cells and a data line and having a control gate connected to a first select line;
adjusting a threshold voltage of a second select gate to a second range of threshold voltages, the second select gate connected in series between a second string of series-connected memory cells and the data line and having a control gate connected to the first select line, wherein the first range of threshold voltages and the second range of threshold voltages are mutually exclusive;
adjusting a threshold voltage of a third select gate to the second range of threshold voltages, the third select gate connected in series between a third string of series-connected memory cells and the data line and having a control gate connected to the first select line;
adjusting a threshold voltage of a fourth select gate to the second range of threshold voltages, the fourth select gate connected in series between the first select gate and the data line and having a control gate connected to a second select line;
adjusting a threshold voltage of a fifth select gate to the first range of threshold voltages, the fifth select gate connected in series between the second select gate and the data line and having a control gate connected to the second select line;
adjusting a threshold voltage of a sixth select gate to the second range of threshold voltages, the sixth select gate connected in series between the third select gate and the data line and having a control gate connected to the second select line;
adjusting a threshold voltage of a seventh select gate to the second range of threshold voltages, the seventh select gate connected in series between the fourth select gate and the data line and having a control gate connected to a third select line;
adjusting a threshold voltage of an eighth select gate to the second range of threshold voltages, the eighth select gate connected in series between the fifth select gate and the data line and having a control gate connected to the third select line; and
adjusting a threshold voltage of a ninth select gate to the first range of threshold voltages, the ninth select gate connected in series between the sixth select gate and the data line and having a control gate connected to the third select line.

15. The method of claim 14, wherein adjusting the threshold voltage of the second select gate to the second range of threshold voltages comprises adjusting the threshold voltage of the second select gate to a range of threshold voltages lower than the first range of threshold voltages.

16. The method of claim 14, wherein adjusting the threshold voltage of the first select gate to the first range of threshold voltages and adjusting the threshold voltage of the fifth select gate to the first range of threshold voltages comprises programming the first select gate and programming the fifth select gate.

17. The method of claim 16, wherein adjusting the threshold voltage of the second select gate to the second range of threshold voltages and adjusting the threshold voltage of the third select gate to the second range of threshold voltages comprises erasing the second select gate and erasing the third select gate.

18. The method of claim 14, wherein adjusting the threshold voltage of the second select gate connected in series between the second string of series-connected memory cells and the data line comprises the second string of series-connected memory cells in a location selected from a group consisting of adjacent the first string of series-connected memory cells, adjacent the third string of series-connected memory cells, and between the first string of series-connected memory cells and the third string of series-connected memory cells.

19. A method of operating a memory, comprising:
adjusting a respective threshold voltage of each select gate of a first plurality of select gates connected in series between a first string of series-connected memory cells and a data line such that one select gate of the first plurality of select gates has its respective threshold voltage in a first range of threshold voltages, and each remaining select gate of the first plurality of select gates has its respective threshold voltage in a second range of threshold voltages mutually exclusive from the first range of threshold voltages;
adjusting a respective threshold voltage of each select gate of a second plurality of select gates connected in series between a second string of series-connected memory cells and the data line such that one select gate of the second plurality of select gates has its respective threshold voltage in the first range of threshold voltages, and each remaining select gate of the second plurality of select gates has its respective threshold voltage in the second range of threshold voltages;
adjusting a respective threshold voltage of each select gate of a third plurality of select gates connected in series between a third string of series-connected memory cells and the data line such that one select gate of the third plurality of select gates has its respective threshold voltage in the first range of threshold voltages, and each remaining select gate of the third plurality of select gates has its respective threshold voltage in the second range of threshold voltages,
wherein each select gate of the first plurality of select gates shares a select line with a respective select gate of the second plurality of select gates and with a respective select gate of the third plurality of select gates;
wherein the select line of the one select gate of the first plurality of select gates is isolated from the select line of the one select gate of the second plurality of select gates and from the select line of the one select gate of the third plurality of select gates; and
wherein the select line of the one select gate of the second plurality of select gates is isolated from the select line of the one select gate of the third plurality of select gates.

20. The method of claim 19, wherein adjusting the respective threshold voltage of each select gate of the first plurality of select gates connected in series between the first string of series-connected memory cells and the data line and adjusting the respective threshold voltage of each select gate of the second plurality of select gates connected in series between the second string of series-connected memory cells and the data line further comprises the first string of series-connected memory cells selectively connected to a first source and the string of series-connected memory cells selectively connected to a second source different than the first source.

21. A method of operating a memory, comprising:
applying a first set of signals to respective access lines of a plurality of access lines, each commonly connected to a control gate of a respective memory cell of a first string of series-connected memory cells selectively connected to a data line, to a control gate of a respective memory cell of a second string of series-connected memory cells selectively connected to the data line, and to a control gate of a respective memory cell of a third string of series-connected memory cells selectively connected to the data line;
while applying the first set of signals to the respective access lines of the plurality of access lines, applying a second set of signals to respective select lines of a plurality of select lines, each commonly connected to a control gate of a respective select gate of a first plurality of select gates connected in series between the first string of series-connected memory cells and the data line, to a control gate of a respective select gate of a second plurality of select gates connected in series between the second string of series-connected memory cells and the data line, and to a control gate of a respective select gate of a third plurality of select gates connected in series between the third string of series-connected memory cells and the data line; and
in response to applying the first set of signals to the respective access lines of the plurality of access lines and applying the second set of signals to the respective select lines of the plurality of select lines, connecting the first string of series-connected memory cells to the data line, and isolating each memory cell of the second string of series-connected memory cells and each memory cell of the third string of series-connected memory cells from the data line.

22. The method of claim 21, wherein applying the first set of signals to a particular access line of the plurality of access lines connected to the control gate of its respective memory cell of the first string of series-connected memory cells comprises the first string of series-connected memory cells in a location selected from a group consisting of adjacent the second string of series-connected memory cells, adjacent the third string of series-connected memory cells, and between the second string of series-connected memory cells and the third string of series-connected memory cells.

* * * * *